United States Patent
Muthiah (10) Patent No.: US 11,221,950 B2
(45) Date of Patent: *Jan. 11, 2022

(54) STORAGE SYSTEM AND METHOD FOR INTERLEAVING DATA FOR ENHANCED QUALITY OF SERVICE

(71) Applicant: Western Digital Technologies, Inc., San Jose, CA (US)

(72) Inventor: Ramanathan Muthiah, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 28 days.

This patent is subject to a terminal disclaimer.

(21) Appl. No.: 16/720,600

(22) Filed: Dec. 19, 2019

(65) Prior Publication Data

US 2021/0191860 A1    Jun. 24, 2021

(51) Int. Cl.
| | |
|---|---|
| *G06F 12/06* | (2006.01) |
| *H03M 13/27* | (2006.01) |
| *G06F 12/02* | (2006.01) |
| *G06F 11/30* | (2006.01) |
| *G11C 16/34* | (2006.01) |
| *H03M 13/00* | (2006.01) |

(52) U.S. Cl.
CPC ...... *G06F 12/0607* (2013.01); *G06F 11/3037* (2013.01); *G06F 12/0246* (2013.01); *G06F 12/0292* (2013.01); *G11C 16/3463* (2013.01); *H03M 13/2782* (2013.01); *H03M 13/6569* (2013.01); *G06F 2212/7201* (2013.01)

(58) Field of Classification Search
None
See application file for complete search history.

(56) References Cited

U.S. PATENT DOCUMENTS

| | | | | |
|---|---|---|---|---|
| 5,341,486 A | * | 8/1994 | Castle | G06F 12/0607 |
| | | | | 711/157 |
| 5,341,489 A | * | 8/1994 | Heiberger | G06F 12/0607 |
| | | | | 348/231.6 |
| 5,463,755 A | * | 10/1995 | Dumarot | G06F 12/0607 |
| | | | | 710/107 |
| 5,754,566 A | | 5/1998 | Christopherson et al. | |
| 5,878,203 A | | 3/1999 | Matsumoto et al. | |
| 5,898,710 A | | 4/1999 | Amrany | |
| 6,928,590 B2 | | 8/2005 | Ilkbahar et al. | |
| 7,178,088 B2 | | 2/2007 | Hashimoto et al. | |

(Continued)

OTHER PUBLICATIONS

Chang et al. "An Adaptive, Low-Cost Wear-Leveling Algorithm for Multichannel Solid-State Disks." Dec. 2013. ACM. ACM Transactions on Embedded Computing Systems. vol. 13. Article 55.*

(Continued)

*Primary Examiner* — Nathan Sadler
(74) *Attorney, Agent, or Firm* — Crowell & Moring LLP (57) ABSTRACT

A storage system and method for interleaving data for enhanced quality of service are provided. In one embodiment, a storage system is presented comprising a memory and a controller. The controller is configured to determine a skip length for interleaving data received from a host; interleave the data according to the determined skip length; store the interleaved data in the memory; and update a logical-to-physical address table to reflect the interleaved data. Other embodiments are provided.

20 Claims, 9 Drawing Sheets

(56) References Cited

U.S. PATENT DOCUMENTS

| | | | |
|---|---|---|---|
| 8,788,910 B1* | 7/2014 | Northcott | G06F 11/1012 |
| | | | 714/773 |
| 10,223,199 B2 | 3/2019 | Hahn et al. | |
| 2004/0064782 A1 | 4/2004 | Lerner et al. | |
| 2005/0144361 A1* | 6/2005 | Gonzalez | G06F 12/0246 |
| | | | 711/103 |
| 2010/0316137 A1* | 12/2010 | Long | H04N 19/59 |
| | | | 375/240.27 |
| 2011/0246863 A1 | 10/2011 | Miyauchi | |
| 2013/0275657 A1* | 10/2013 | Kim | G06F 12/0246 |
| | | | 711/103 |
| 2013/0346831 A1 | 12/2013 | Ha | |
| 2014/0281174 A1* | 9/2014 | Lee | G06F 3/0613 |
| | | | 711/103 |
| 2015/0161044 A1 | 6/2015 | Lasser | |
| 2015/0169465 A1 | 6/2015 | Slepon | |
| 2015/0347026 A1 | 12/2015 | Thomas | |
| 2018/0088948 A1* | 3/2018 | Rasale | G06F 9/3455 |
| 2018/0246783 A1 | 8/2018 | Avraham et al. | |
| 2020/0105835 A1* | 4/2020 | Kuo | G11C 13/003 |
| 2020/0272339 A1 | 8/2020 | Oberg | |
| 2021/0191647 A1* | 6/2021 | Muthiah | G06F 3/0659 |

OTHER PUBLICATIONS

PGP. "How Whole Disk Encryption Works." 2010. https://community.pepperdine.edu/it/content/how-wde-works.pdf.*

International Search Report dated Sep. 3, 2020 for International Application No. PCT/US2020/024378.

Written Opinion dated Sep. 3, 2020 for International Application No. PCT/US2020/024378.

International Search Report dated Sep. 3, 2020 for International Application No. PCT/US2020/024552.

Written Opinion dated Sep. 3, 2020 for International Application No. PCT/US2020/024552.

Office Action in U.S. Appl. No. 16/720,455, dated Feb. 16, 2021, 20 pages.

* cited by examiner

STORAGE SYSTEM AND METHOD FOR INTERLEAVING DATA FOR ENHANCED QUALITY OF SERVICE

BACKGROUND

A storage system can be used to store a data stream sent to it by a host. Some host applications, such as media-specific applications, are very sensitive to burst errors or continuous access latency in data, as it directly impacts the system's quality of service. In many cases, the host application can withstand data failures as long as they are within a limit. For example, one media application may be able to withstand an "X" kilobyte (KB) failure without much quality of service impact, while another media application may have a different threshold for withstanding failure before a degrading effect is noticed. Burst errors and latency can be caused by a weak section of memory in the storage system. For example, weak wordlines in a memory block of a three-dimensional flash memory can result in latency when the storage system attempts read retries of data fragments in neighboring memory locations. If the error correction algorithm used by the storage system is not sufficient to handle the burst latency, the host can store the data redundantly in the memory. For example, a redundant array of independent disks (RAID) can be used to rely on different physical memory devices to protect the data and, therefore, increase redundancy for improved quality of service.

DETAILED DESCRIPTION

Overview

By way of introduction, the below embodiments relate to a storage system and method for interleaving data for enhanced quality of service. In one embodiment, a storage system is presented comprising a memory and a controller. The controller is configured to determine a skip length for interleaving data received from a host; interleave the data according to the determined skip length; store the interleaved data in the memory; and update a logical-to-physical address table to reflect the interleaved data.

In some embodiments, the controller is further configured to determine the skip length based on a frame size of the data.

In some embodiments, the controller is further configured to determine the skip length based on a size of a group of pictures (GOP) of the data.

In some embodiments, the controller is further configured to determine the skip length based on an archive status of the data.

In some embodiments, the controller is further configured to determine the skip length based on a threshold number of frames of a codec.

In some embodiments, the controller is further configured to determine the skip length based on a history of failures.

In some embodiments, the controller is further configured to determine the skip length based on an instruction from the host.

In some embodiments, the memory comprises a three-dimensional memory.

In some embodiments, the storage system is configured to be integrated in the host.

In some embodiments, the storage system is configured to be removably connected with the host.

In another embodiment, a method for interleaving data is provided that is performed in a storage system comprising a memory. The method comprises: determining how far apart to store consecutive units of data received from a host; rearranging the data such that consecutive units of data are spaced as far apart as determined; storing the rearranged data in the memory; and updating a logical-to-physical address table to reflect the interleaved data.

In some embodiments, determining how far apart to store consecutive units of data is based on a frame size of the data.

In some embodiments, determining how far apart to store consecutive units of data is based on a size of a group of pictures (GOP) of the data.

In some embodiments, determining how far apart to store consecutive units of data is based on an archive status of the data.

In some embodiments, determining how far apart to store consecutive units of data is based on a threshold number of frames of a codec.

In some embodiments, determining how far apart to store consecutive units of data is based on a history of failures.

In some embodiments, determining how far apart to store consecutive units of data is based on an instruction from the host.

In another embodiment, a storage system is provided comprising a memory; means for determining a skip length for interleaving data received from a host; means for interleaving data according to the determined skip length; means for storing the interleaved data in the memory; and means for updating a logical-to-physical address table to reflect the interleaved data.

In some embodiments, the storage system is configured to be integrated in the host.

In some embodiments, the storage system is configured to be removably connected with the host.

Other embodiments are possible, and each of the embodiments can be used alone or together in combination. Accordingly, various embodiments will now be described with reference to the attached drawings.

Embodiments

Figures 1A, 1B:
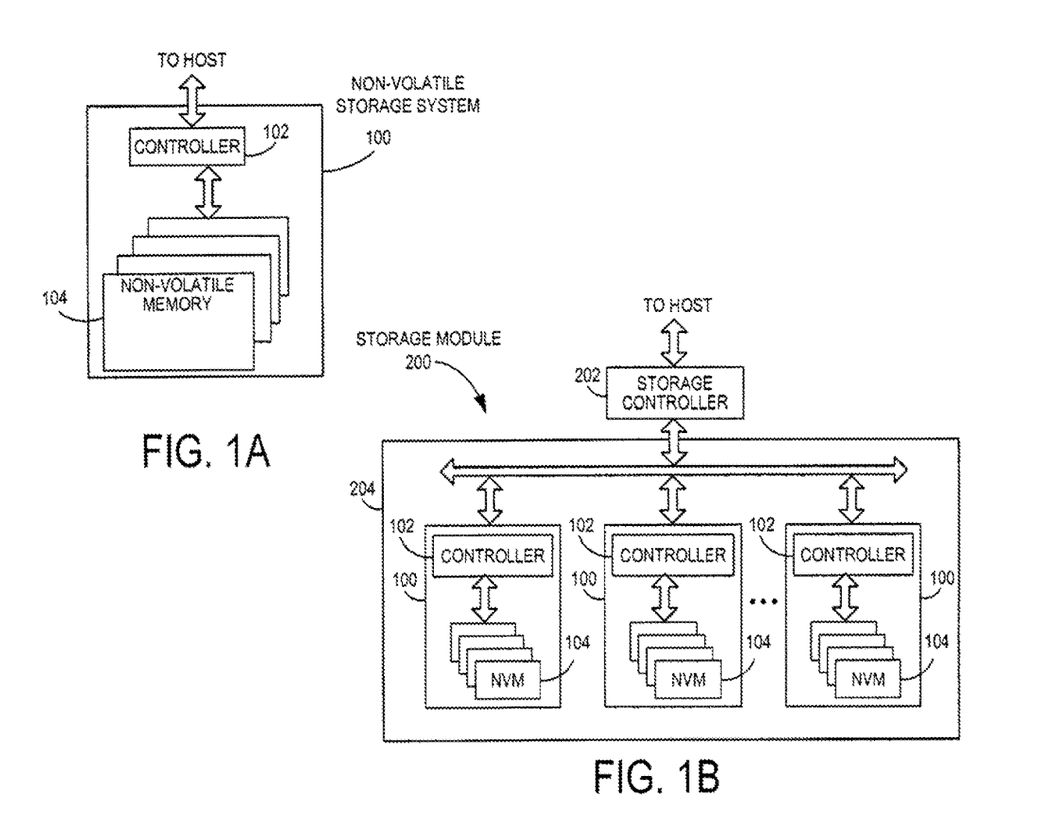
FIG. 1A is a block diagram of anon-volatile storage system of an embodiment.
FIG. 1B is a block diagram illustrating a storage module of an embodiment.
Figure 1C:
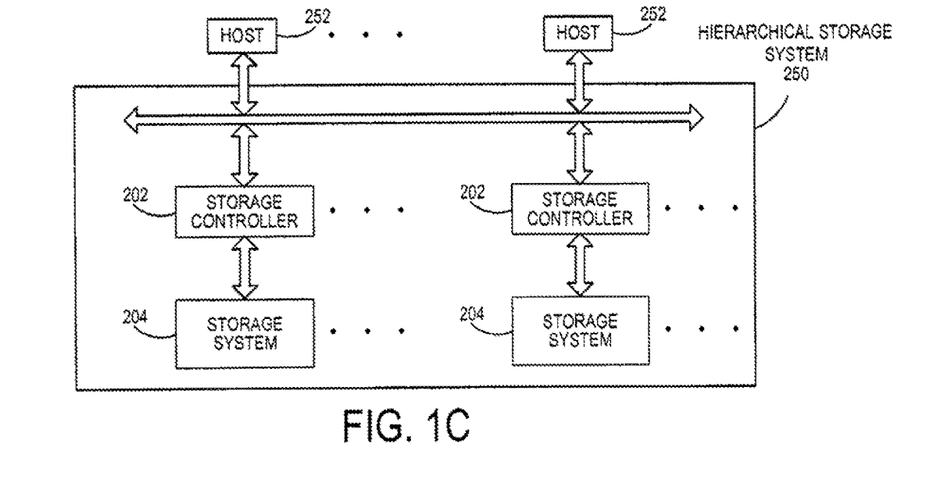
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
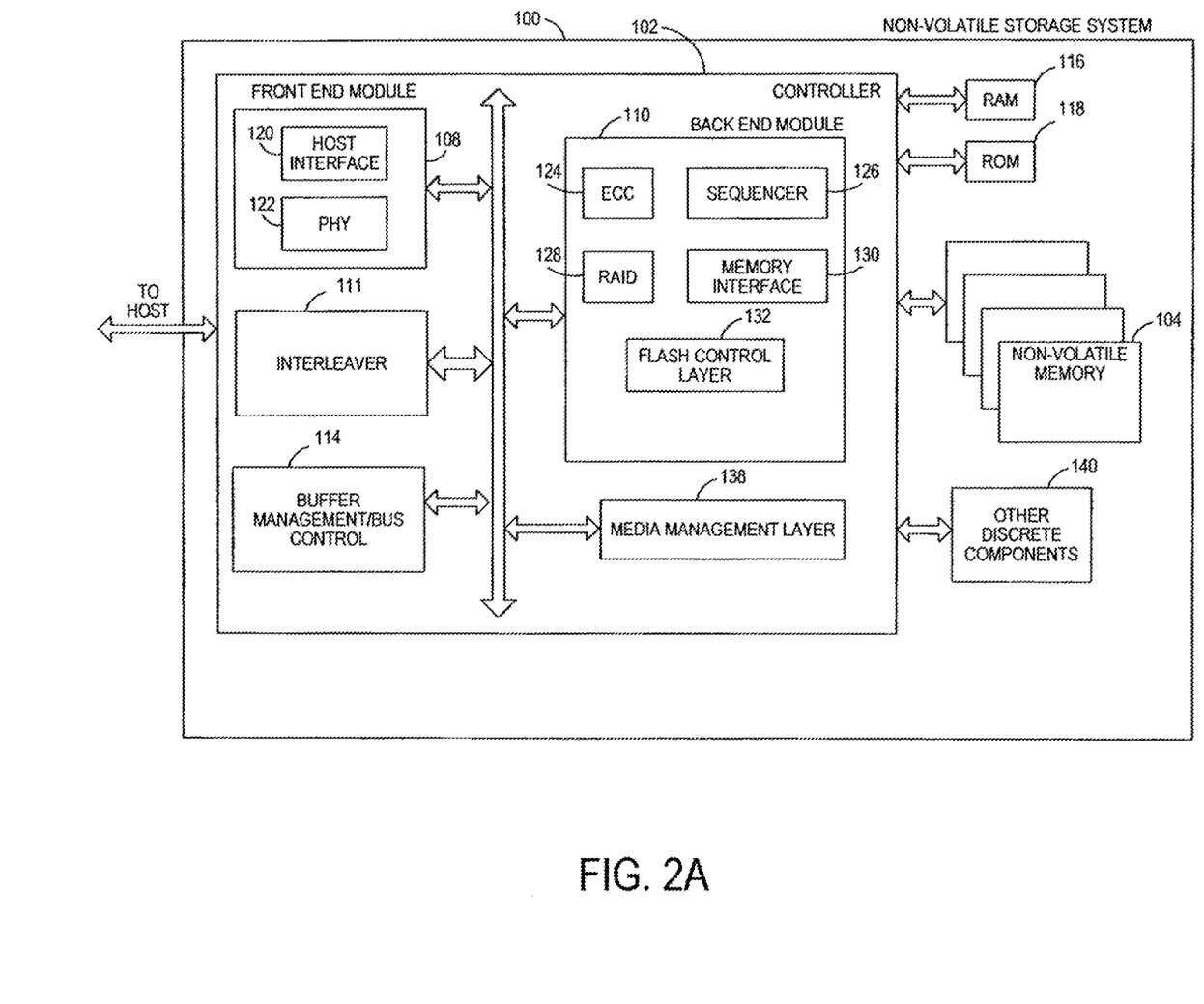
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include an interleaver 111, which is discussed in more detail below, and can be implemented in hardware or software/firmware to extract various video frames from a video stream. The interleaver 111 can be configured to perform the algorithms and methods discussed below and shown in the attached drawings.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
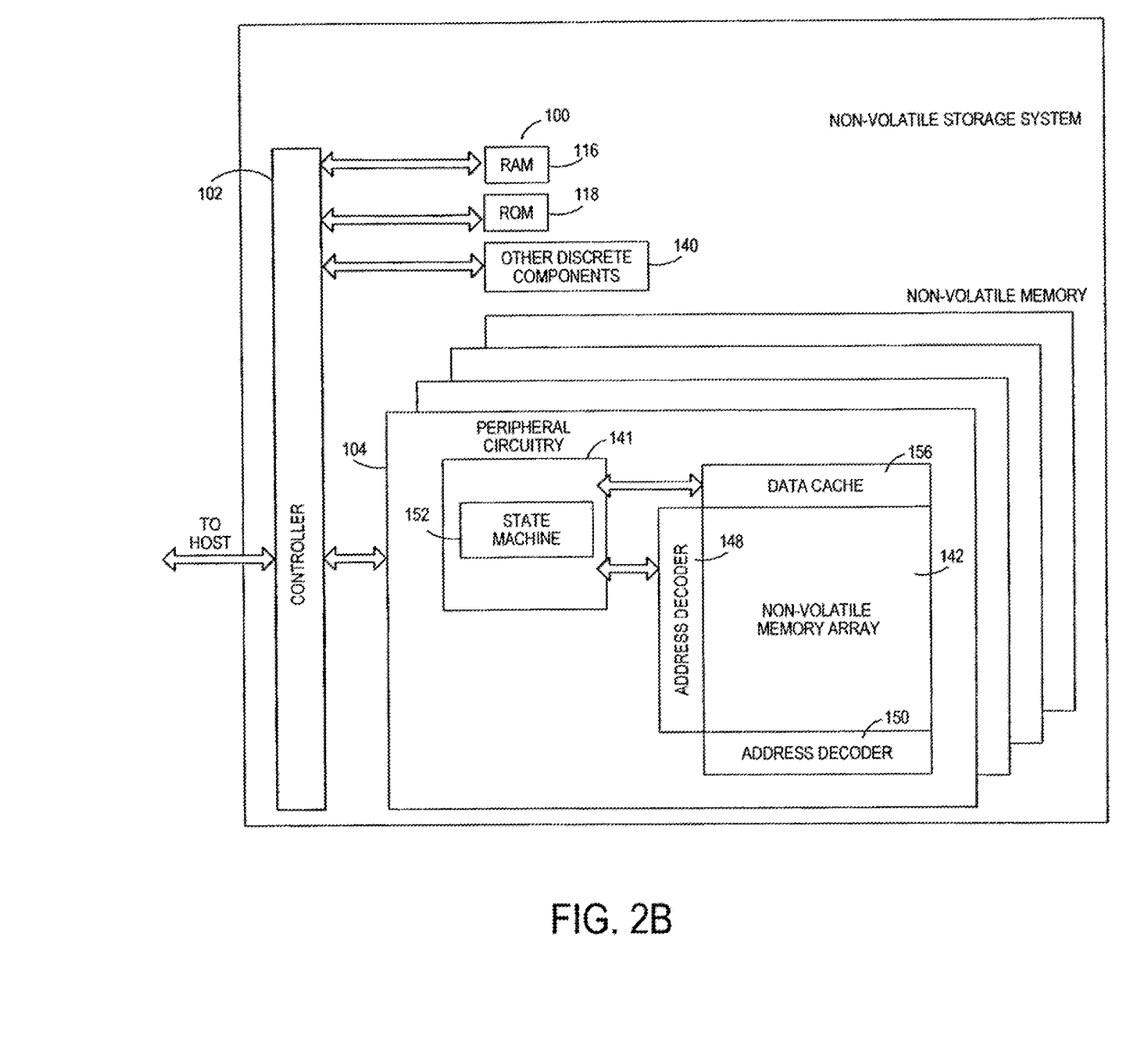
FIG. 2B is a block diagram illustrating components of the non-volatile memory storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102 and address decoders 148, 150.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

As mentioned above, a storage system can be used to store a data stream sent to it by a host. Some host applications, such as media-specific applications (e.g., applications that play back video and/or audio data), are very sensitive to burst errors or continuous access latency in data, as it directly impacts the system's quality of service. In many cases, the host application can withstand data failures as long as they are within a limit. For example, one media application may be able to withstand an "X" kilobyte (KB) failure without much quality of service impact, while another media application may have a different threshold for withstanding failure before a degrading effect is noticed.

Burst errors/burst latency with high density three-dimensional memories can be challenging since user applications find it difficult to overcome such errors without a quality of service impact. For example, while a loss of a single video frame would probably not have a significant impact on quality of service, the loss of multiple continuous video frames in a short span of time would. Burst errors and latency can be caused by a weak section of memory in the storage system (e.g., memory nodes, wordline, string, or plane-to-plane shorts). For example, weak wordlines in a memory block of a three-dimensional flash memory can result in latency when the storage system attempts read retries of data fragments in neighboring memory locations.

Typically, error correction algorithms, such as an XOR checker matrix scheme, can usually recover failure of one bin (e.g., a 16K plane). However, any recovery beyond that may need a good amount of XOR bins, leading to a greater RAM requirement. If the error correction algorithm used by the storage system is not sufficient to handle the burst latency, the host can store the data redundantly in the memory. For example, a redundant array of independent disks (RAID) can be used to rely on different physical memory devices to protect the data and, therefore, increase redundancy for improved quality of service. However, the problem with redundantly storing data is that it increases write amplification.

The following embodiments can be used to enhance quality of service without redundancy/increasing write amplification. In prior systems, media data is usually sequential in nature and is written to the memory 104 as a single logical entity into a logical block as given by the host 300. Any failure in any region sometimes can span across a few kilobytes of continuous data, impacting the quality of service of the user playback system. In the below embodiments, data to be written is interleaved in the memory 104 and stored (e.g., such that the skip length of interleaving is at least a threshold number of frames of codec media data). That way, burst errors/latency in the memory will be reflected as multiple, smaller errors that are separated well apart. As a result, fewer contiguous frames of a stream would be impacted, thereby reducing quality of service degradation. With these embodiments, archived data can be stored such that the quality of service degradation due to memory errors is contained within limits. Further, a quality of service guarantee can be traded off with buffering and performance.

The interleaving can be done either by the host or by the storage system 100. The following paragraphs will discuss both embodiments.

Figure 3A:
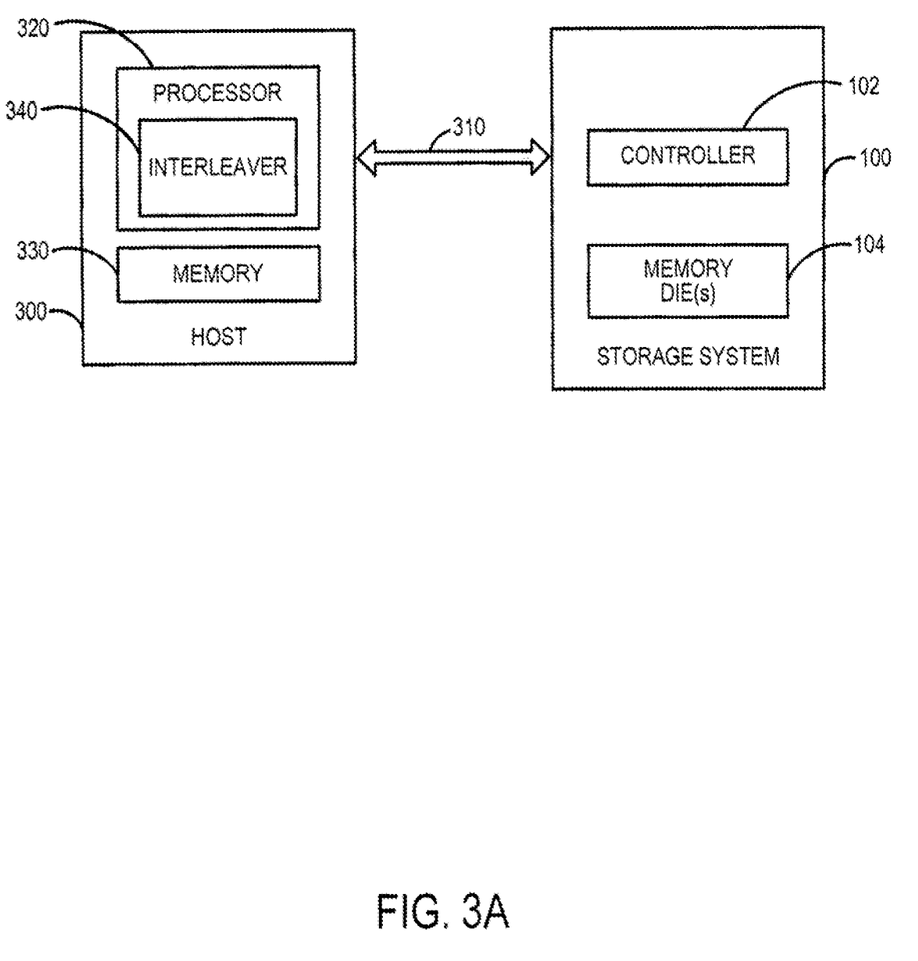
FIG. 3A is a block diagram of a host and a storage system of an embodiment.

Turning first to an example host implementation, FIG. 3A is a block diagram of a host 300 and a storage system 100 of an embodiment connected via bus 310. The host 300 can take any suitable form, including, but not limited to, a computer, a mobile phone, a tablet, a wearable device, a digital video recorder, a surveillance system, etc. The host 300 in this embodiment comprises a processor 320 and a memory 330. The processor 320 is configured to implement an interleaver 340. In one embodiment, computer-readable program code of the interleaver 340 is stored in the memory 330 and is executed by the processor 320 (i.e., the interleaver 340 can be software/firmware executed by hardware). In another embodiment, the interleaver 340 is implemented exclusively in hardware.

Figure 3B:
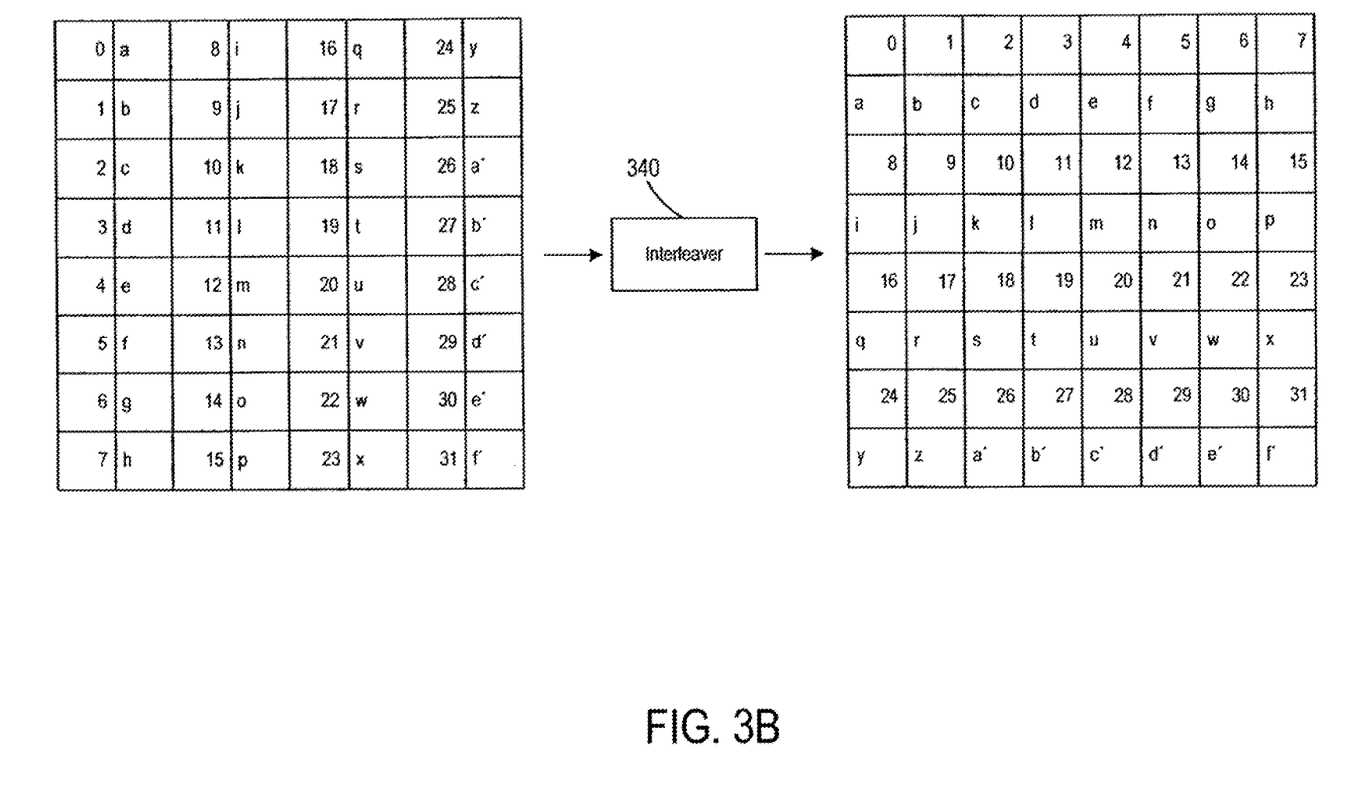
FIG. 3B is an illustration of an operation of an interleaver of an embodiment.

FIG. 3B illustrates the functionality of the interleaver 340 of an embodiment. In general, the interleaver 340 reorders the storing of the data in the storage system 100 such that data is stored in a different order than if the interleaver 340 was not used. For example, in FIG. 3B, instead of data elements 1-7 being stored all in the first column of a memory array, each data element is stored in a different column. As a result, a catastrophic error to the first column would only result in the loss of one data element (instead of all the data elements), which enhances quality of service. Of course, this is just one example, and other type of interleaving can be used.

In one embodiment, when data is to be archived in the storage system 100, the host 300 determines an appropriate skip length for data interleaving according to the frame size of the media. The interleaver 340 then interleaves the data according to the media application's requirement before streaming to the storage system 100 (e.g., according to its archive status/coldness), as well as manages the interleaving parameters for a given block of data. When later accessing the stored data, the host 300 buffers the data, and the interleaver 340 performs de-interleaving of the data before consumption.

In general, in this embodiment, data is split into units, and the units of data are passed to the interleaver 340 managed by the host 300. Only the output of the interleaver 340 is routed to the storage system 100 for storage. The data is buffered in the host 300 and segregated, such that a worst-case burst error/latency results in a smaller error or latency spread over a time period to reduce the playback quality-of-service impact.

The media codec can be parsed to estimate the skip length (i.e., how far apart to place adjacent units of data). For example, the size of the media frame may be a factor in deciding the depth. In some other cases, the typical size of a group of pictures (GOP) could decide the length. In some cases, the host 300 may estimate the worst-case burst error/burst latency of the storage system 100 through previous learnings (e.g., consecutive failed units), make an initial fair estimate, and dynamically tune the skip length going forward according to its requirement. The host 300 can use any way to parse the data and its media header to decide the skip length of interleaving. It may also decide to perform interleaving only for data to be archived, as segregation leads to a performance drop.

During data retrieval, the data is de-interleaved prior to usage. In this embodiment, the onus is on the host to de-interleave the data back to its original form, and the storage system 100 is unaware of interleaving aspects in the design.

Figure 4:
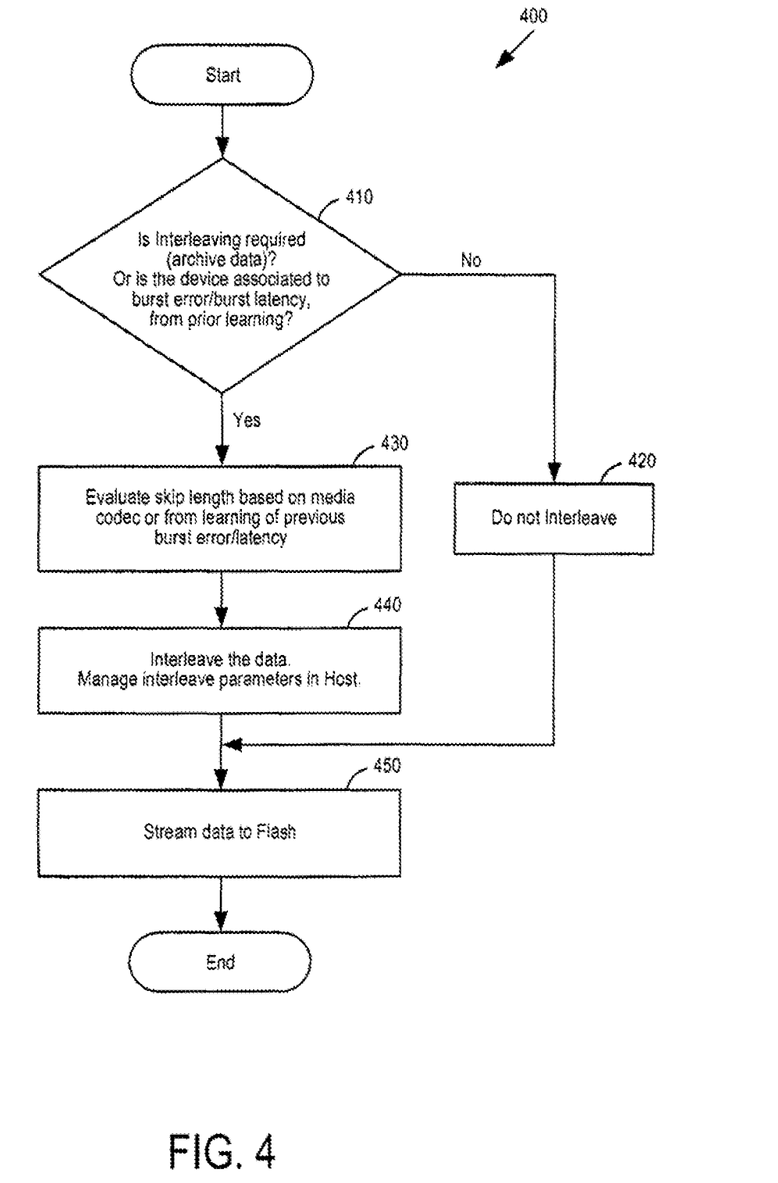
FIG. 4 is a flow chart of an embodiment for data interleaving.

Turning again to the drawings, FIG. 4 is a flow chart 400 of a method of an embodiment for data interleaving according to media data type in the storage system 100. As shown in FIG. 4, when storing data in the storage system 100, the host 300 decides whether interleaving is required (act 410). Interleaving can be required, for example, if the data is to be archived (cold data to be stored for a relatively-long period of time) or if the storage system 100 is associated with a burst error/burst latency (e.g., as determined from prior learning). If interleaving is not required, the host 300 does not interleave and sends the data in its original form to the storage system 100 for storage (acts 420 and 450). However, if interleaving is required, the host 300 evaluates the skip length based on, for example, the media codec or from learning previous burst error/latency data (act 430). Next, the interleaver 340 interleaves the data and manages the interleave parameters in the host (act 440). The host 300 then sends the interleaved data to the storage system 100 for storage (act 450).

It should be noted that this embodiment does not need to correct errors. Instead, this embodiment physically spreads out existing errors over a longer time period in order to reduce the probability of multiple errors existing in the same time/location. When errors are spread out, the host application can better compensate for them ("stubbed by host and recovered"), and playback quality is improved.

Figure 5:
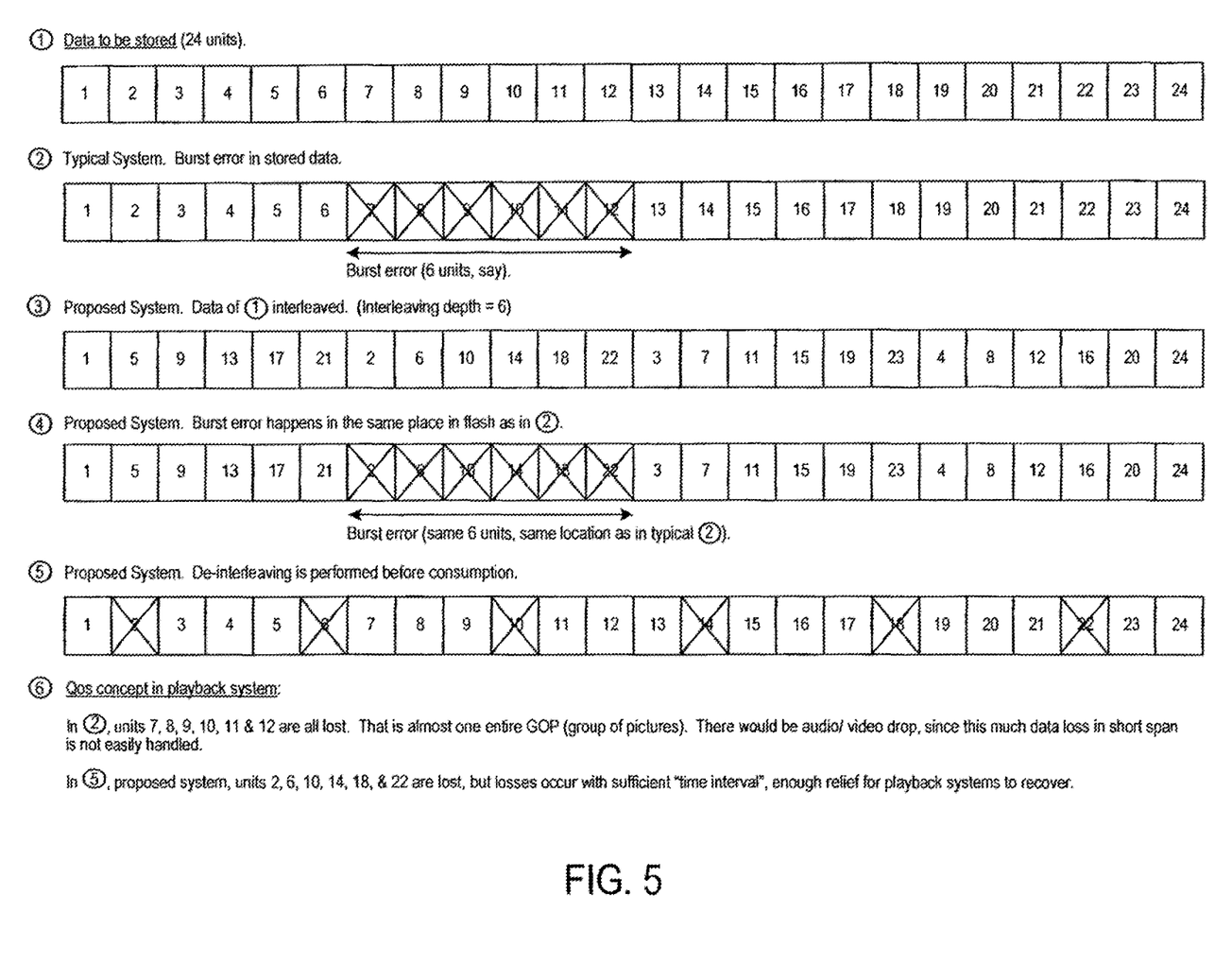
FIG. 5 is an illustration that explains an advantage of data interleaving of an embodiment.

FIG. 5 illustrates this advantage. Situation 1 in FIG. 5 shows 24 units of data stored consecutively in the memory 104 in the storage system 100. Situation 2 shows a burst error that affects units 7-12. With six consecutive units of data affected, quality of service can regrade below a minimum level. But, as shown in Situations 3-5, if the data is interleaved, the same burst affects non-consecutive data units, thereby avoiding the quality of service problem in Situation 2.

While this embodiment can be used with any type of data, this embodiment may be particularly desired for data that will be stored for a long time (cold data), such as a compressed surveillance video stream (e.g., stored in the Moving Picture Experts Group Transport Stream (MPEG-TS) format). In general, with video compression, different video frames are compressed using different compression algorithms. Different video frames can be classified into different picture or frame types. Three of the major picture types are intra-coded picture frames (I-frames), predicted picture frames (P-frames), and bidirectional predicted picture frames (B-frames). I-frames are the least compressible but are independent in that they can be decoded without reference to other video frames. An I-frame can be a complete image, such as a Joint Photographic Experts Group (JPEG) image file. In contrast, a predicted picture frame (P-frame) (or delta frame) contains the changes in the image from the previous frame and requires reference to other video frames to be decompressed. However, P-frames are more compressible that I-frames. A bidirectional predicted picture frame (B-frame) contains differences between the current frame and both the preceding and following frames. Accordingly, B-frames provide the highest amount of data compression. I-, B-, and P-frames can be different sizes.

Typically, the entire surveillance video stream is stored as a single entity, which is usually advantageous because the data can be easily stored and retrieved that way. With surveillance data, typically only a portion of the data is required to be stored after a period of time. The data may never be read, but, if read, it should be well protected, and this embodiment can be used provide the desired quality of service of the playback system.

For example, consider the following surveillance use case. Assume eight groups of pictures (GOP) in one second of H.264 video data, and also assume one megabyte per second (MBPS) video rate quality. In this example, one GOP consisting of one I frame and multiple P and B frames is 125 KB. Lower video quality configurations have even lesser frame sizes, and one GOP could potentially be less than 96 KB. If a burst error/latency in the memory 104 results in a momentary loss of most of that GOP, almost the whole GOP is gone, impacting the quality of service. Whereas in this embodiment, a burst error/latency on interleaved data could mean loss or delay of a few interspersed individual frames in different GOPs, which could still be stubbed by the host 300 and recovered by the time another frame failure has to be handled.

As mentioned above, the interleaving functionality can be performed by the host 300 or the storage system 100. In general, there are several potential differences between the two implementations. For example, different logical-to-physical (L2P) address handling may be needed. Also, de-interleaving may be required for the host-side handling but not for storage-system-side handling (the non-requirement of de-interleaving can be due to L2P abstraction). Further, host-side handling can be based on media data alone, whereas storage-system-side handling can be based on both media data as well as the storage system's internal burst defects parts per million (DPPM), which may not be an attribute with host-side handling.

While the paragraphs illustrated an example of the host 50 implementation, the below paragraphs illustrate an example of the storage system 100 implementation. In general, with the storage system 100 implementation, data to be written is interleaved and stored in the memory 104 (e.g., such that the skip length of interleaving is at least a threshold number of frames of codec media data). The skip length of interleaving can be dynamically decided the storage system 100 according to the parsed media. The logical-to-physical (L2P) address map can be updated taking into consideration the final interleaved data (e.g., the logical entries are no more in sequence). Further, in one embodiment, de-interleaving does not need to be performed during memory access since the L2P table already accommodates physical routings.

In this embodiment, data to be written to the memory 104 is split into units and passed on to the interleaver 111 in the storage system 100. The skip length of interleaving can be dynamically decided according to the parsed media format and can be chosen so that it is at least a threshold number of frames of media data. The output of the interleaver 111 is stored in the memory 104. The logical-to-physical address (L2P) map is updated taking into consideration the explicit interleaved data (as the logical entries are no longer in sequence in a logical metablock in the memory 104). No other interleaving parameters have to be tracked since the L2P map abstracts it. Unlike the host-side embodiment discussed above, de-interleaving is not required in the read path of this embodiment since the L2P table takes care of the physical routings. Quality of service is maintained by distributing the burst errors/burst latency according to the skip length. In a related approach, the host 300 can soft instruct the storage system 100 on archive data and additionally interleave skip length.

As mentioned above, this embodiment may be especially desired in media data that becomes cold or is archived, such as surveillance data. For example, the size of the media frame may be a factor in deciding the depth. In some other cases, the typical size of a group of pictures could decide the length.

It should be noted that with logical blocks created out of multiple memory dies, some amount of interleaving is already taking place in typical storage solutions. However, this is not guaranteed and is not required at fine granular levels. Unlike that "implicit" interleaving, this embodiment provides "explicit" interleaving (e.g., as low as ECC granularity of 2K or 4K), allowing the storage system 100 to trade off performance and interleaving. This embodiment, in addition to existing XOR correction schemes, can provide better quality of service in terms of recoverability. This embodiment can also be used to guarantee a minimal defect part per million (ppm) for a burst error of a definite size.

The storage system 100 can use any way to parse incoming data and its media header to distinguish it from random and hot data. Further, interleaving can be performed on any desired data (e.g., only on archived data, so that non-cold data is bypassed from interleaving). Also, although this embodiment may be especially desired for continuous data, such as for media, other applications wanting to spread a given burst error/burst device latency over time can also utilize it.

Figure 6:
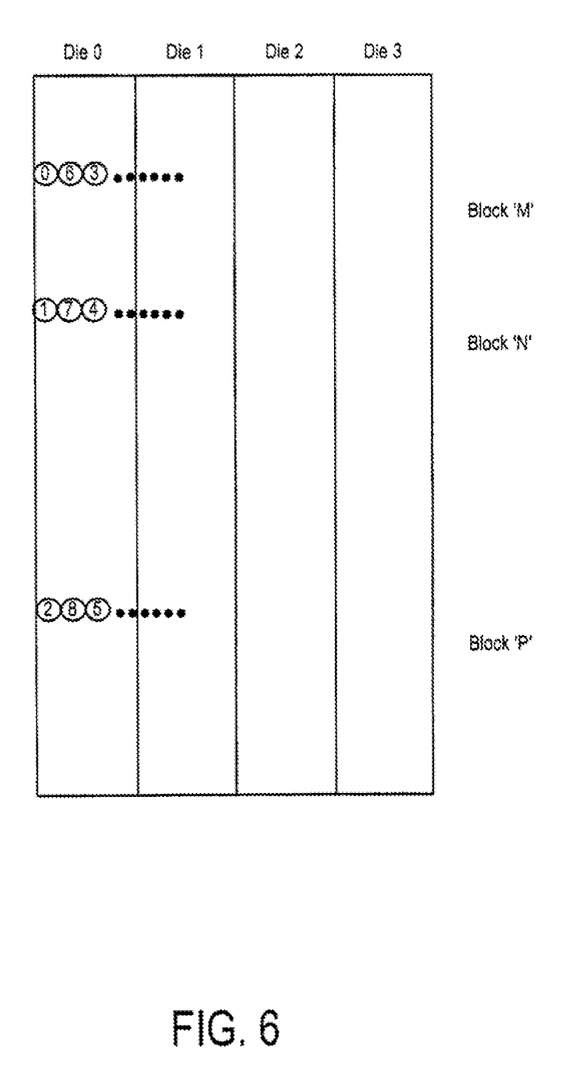
FIG. 6 is an illustration of storage of interleaved data of an embodiment.

Returning to the drawings, FIG. 6 is an illustration of storage of interleaved data of an embodiment. As shown in FIG. 6, the interleaved data is stored as follows for incoming host data or data of a garbage collection process during internal data movement: ⓪①②③④⑤⑥⑦⑧ . . . , M, N, and P are separate logical blocks of in the system 100. In this example, an 8k granularity is used, although other granularity (e.g., 4K, 8K, or 16K) can be used for the units. In general, the finer the granularity, the better the interleaving but with more control overhead.

It may be noted that some buffering may be done in the device 100. The data is streamed to multiple open blocks to safeguard it from localized errors. Where multiple continuous streams are written together, all can be interleaved into multiple logical blocks. It may be noted that the technology does not correct errors. Instead, the technology physically spreads out existing errors over a longer time period in order to reduce the probability of multiple errors existing in the same time/location. When errors are spread out, the host application can better compensate for them ("stubbed by host and recovered"), and playback quality is improved.

In another related approach, the host 300 can instruct the storage system 100 on skip length and to interleave the data using existing interface infrastructure. Also, it should be noted that, in this embodiment, some data may have to be cached in the device/latches to enable optimum programming. As such, the L2P control overhead may increase in the read path. To handle this, the storage system 100 may only want to perform interleaving on realizing that the media data is meant for cold storage.

Figure 7:
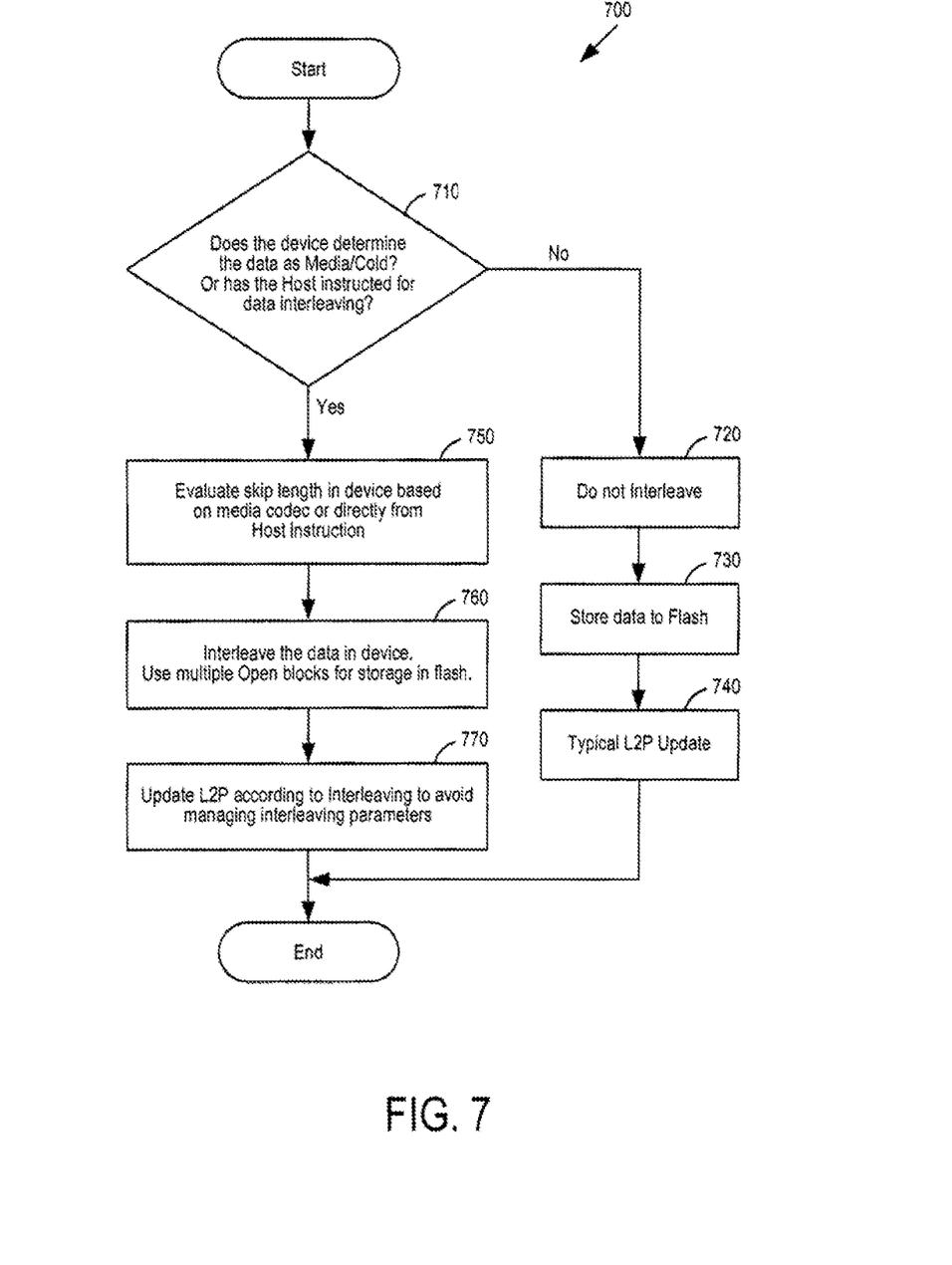
FIG. 7 is a flowchart of an embodiment for data interleaving.

Turning again to the drawings, FIG. 7 is a flow chart 700 of an embodiment for data interleaving. As shown in FIG. 7, the controller 102 in the storage system 100 first determines if the data to be stored is media/cold data or if the host instructed the storage system 100 that the data should be interleaved (act 710). If interleaving is not needed, the data is left as-is, is stored in the memory 104, and the logical-to-physical address (L2P) table is updated, as normal (acts 720, 730, and 740). However, if interleaving is needed, the controller 102 evaluates the skip length based on the media codec or based on host instruction (act 750). Next, the interleaver 111 interleaves the data in the memory 104, using multiple open blocks for storage (act 760). Then, the controller 102 updates the L2P table according to the interleaving to avoid managing the interleaving parameters (act 770).

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A method for interleaving data, the method comprising: performing the following in a storage system comprising a memory:
   receiving data from a host for storage in the memory, wherein the data is interleaved with a host-determined skip length and the storage system is unaware that the data is interleaved;
   storing the data in the memory;
   receiving a read command from the host to read the data; and
   in response to receiving the read command, reading the data from the memory and providing the data to the host, wherein the data provided to the host is interleaved and the host is responsible for restoring the interleaved data back to its original form where consecutive units of data are not spaced apart.

2. The method of claim 1, wherein the host determines how far apart to store consecutive units of data based on a frame size of the data.

3. The method of claim 1, wherein the host determines how far apart to store consecutive units of data based on a size of a group of pictures (GOP) of the data.

4. The method of claim 1, wherein the host determines how far apart to store consecutive units of data based on an archive status of the data.

5. The method of claim 1, wherein the host determines how far apart to store consecutive units of data based on a threshold number of frames of a codec.

6. The method of claim 1, wherein the host determines how far apart to store consecutive units of data based on a history of failures.

7. The method of claim 1, wherein the host determines how far apart to store consecutive units of data based on an instruction from the host.

8. The method of claim 1, wherein the skip length used to interleave the data maintains a quality of service above a threshold level when there are errors in portions of the memory storing the data.

9. The method of claim 1, wherein the memory comprises a three-dimensional memory.

10. A storage system comprising:
    a memory; and
    a controller configured to:
      receive data from a host for storage in the memory, wherein the data is interleaved with a host-determined skip length and the storage system is unaware that the data is interleaved;
      store the data in the memory;
      receive a read command from the host to read the data; and
      in response to receiving the read command, read the data from the memory and provide the data to the host, wherein the data provided to the host is interleaved and the host is responsible for de-interleaving the data.

11. The storage system of claim 10, wherein the host is configured to determine the skip length to interleave the data based on a frame size of the data.

12. The storage system of claim 10, wherein the host is configured to determine the skip length to interleave the data based on a size of a group of pictures (GOP) of the data.

13. The storage system of claim 10, wherein the host is configured to determine the skip length to interleave the data based on an archive status of the data.

14. The storage system of claim 10, wherein the host is configured to determine the skip length to interleave the data based on a threshold number of frames of a codec.

15. The storage system of claim 10, wherein the host is configured to determine the skip length to interleave the data based on a history of failures.

16. The storage system of claim 10, wherein the memory comprises a three-dimensional memory.

17. The storage system of claim 10, wherein the storage system is configured to be integrated in the host.

18. The storage system of claim 10, wherein the storage system is configured to be removably connected with the host.

19. The storage system of claim 10, wherein the skip length used to interleave the data maintains a quality of service above a threshold level when there are errors in portions of the memory storing the data.

20. A storage system comprising:
    a memory;
    means for receiving data from a host for storage in the memory, wherein the data is interleaved with a host-determined skip length and the storage system is unaware that the data is interleaved;
    means for storing the data in the memory;
    means for receiving a read command from the host to read the data; and
    means for, in response to receiving the read command, reading the data from the memory and providing the data to the host, wherein the data provided to the host is interleaved and the host is responsible for de-interleaving the data.

* * * * *